(12) United States Patent
Ravesi et al.

(10) Patent No.: US 6,420,238 B1
(45) Date of Patent: Jul. 16, 2002

(54) METHOD OF FABRICATING HIGH-CAPACITANCE CAPACITIVE ELEMENTS IN A SEMICONDUCTOR SUBSTRATE

(75) Inventors: Sebastiano Ravesi, S. A. Li Battiati; Antonello Santangelo, Belpasso, both of (IT)

(73) Assignee: STMicroelectronics S.r.l., Agrate Brianza (IL)

( * ) Notice: Subject to any disclaimer, the term of this patent is extended or adjusted under 35 U.S.C. 154(b) by 0 days.

(21) Appl. No.: 09/468,241

(22) Filed: Dec. 20, 1999

(30) Foreign Application Priority Data

Dec. 22, 1998 (IT) .......................... MO98A2788

(51) Int. Cl.⁷ ...................... H01L 21/20; H01L 21/8242

(52) U.S. Cl. ...................... 438/346; 438/253; 257/30

(58) Field of Search ................. 257/306, 243, 257/385, 665, 684, 300–310; 438/30, 149, 244–253, 384, 386–399

(56) References Cited

U.S. PATENT DOCUMENTS 6,180,976 B1 * 1/2001 Roy .......................... 257/306

* cited by examiner

Primary Examiner—Matthew Smith
Assistant Examiner—Calvin Lee
(74) Attorney, Agent, or Firm—Lisa K. Jorgenson; Robert Iannucci; Seed IP Law Group PLLC

(57) ABSTRACT

Described in the disclosure is a method for fabricating high-capacitance capacitive elements that are integrated in a semiconductor substrate. First a dielectric layer is formed over the surface of the substrate and a metal layer is deposited thereon. The metal layer is patterned and etched to form lower plates of the capacitive elements, as well as to form interconnection pads. Then, an intermediate dielectric layer is deposited on the lower plates and interconnection pads, and over the entire exposed surface of the substrate. Following that, a sacrificial conductive layer is deposited onto the intermediate dielectric layer, and the upper plates of the capacitive elements are formed out of the sacrificial conductive layer. Then, an upper dielectric layer is formed over the entire semiconductor, and openings are formed in this layer for the upper plates and the interconnection pads.

13 Claims, 4 Drawing Sheets

METHOD OF FABRICATING HIGH-CAPACITANCE CAPACITIVE ELEMENTS IN A SEMICONDUCTOR SUBSTRATE

TECHNICAL FIELD

This invention relates to a method of fabricating high-capacitance capacitive elements in a semiconductor substrate.

BACKGROUND OF THE INVENTION

The invention relates particularly but not exclusively to a method of fabricating high-capacitance capacitive elements between successive metallization layers in a multi-level interconnection structure, and the ensuing description will refer to that field of application for convenience of explanation.

Capacitive elements are extensively employed as passive components in integrated electronic circuits. A first known technique for making the plates of a capacitor integrated in a semiconductor substrate includes forming a ply structure which has one or more polysilicon layers isolated from one another by a dielectric layer.

In particular, the conventional capacitive elements have a first plate which is formed in a polysilicon layer provided on the substrate. A dielectric layer is formed over the first capacitor plate. This dielectric layer is subsequently covered with a metallization layer from which the second plate of the capacitive element is made. Alternatively, the capacitive element may be formed from two superposed layers of polysilicon which are isolated from each other by a dielectric layer.

These prior solutions have deficiencies that interfere with the achievement of high quality features. For instance, using polycrystalline silicon (polysilicon) for the capacitor plates causes a high distributed surface resistance. This increased resistance becomes a major factor where capacitive elements of high capacitance, and hence large area, are provided for functional applications. In fact, the surface resistance of p+ doped polysilicon exceeds one hundred Ohms per square centimeter, while that of n+ polysilicon is more than a few tens Ohms per square centimeter.

Another important contributory factor is that capacitive elements having their plates formed from polysilicon layers are fabricated close to the substrate, so that the parasitic capacitance toward the substrate can be substantial, especially with capacitive elements of large area.

From this standpoint, forming the plates of such capacitive elements from layers belonging to metallization levels appears, therefore, to be a more effective solution.

A known technique for fabricating metal plate capacitors consists of forming, on a semiconductor substrate, a metallization layer which is later formed to provide the lower plates of the capacitive elements, as well as to provide interconnection pads.

Thereafter, a thin lower dielectric layer is deposited onto the entire exposed surface to form the dielectric layer between the capacitive element plates. The portions of this lower dielectric layer which lie above the metallization pads are then removed by a photolithographic process to allow a later connection to the next metallization layer. An upper dielectric layer is subsequently deposited onto the entire wafer surface. Openings are then provided in the dielectric layer at the locations of the metallization pads, and at the lower dielectric layer covering the lower capacitor plates.

It should be possible to etch away this upper dielectric layer in a fully selective manner with respect to the lower dielectric layer.

If the upper dielectric layer were unetchable with respect to the lower dielectric layer, then the formation of the contact openings may result in a damaged or destroyed lower dielectric layer, thus impairing the operability of the capacitive elements. Therefore, one factor in determining the quality of the capacitor is the etching of the upper dielectric layer while leaving the lower dielectric layer intact. If the lower dielectric layer is overetched or underetched, the quality of the capacitor is degraded.

The fabrication of the capacitive elements is completed by the deposition and photolithographic patterning of the next metallization level. The last-mentioned step defines the upper plates of the capacitive elements and the connection to the lower metallization layer through the openings.

SUMMARY OF THE INVENTION

Embodiments of the invention provide a method for fabricating high-capacitance capacitive elements that have structural and functional features whereby they can be integrated to the surface layers of the semiconductor circuits, thereby reducing their parasitic capacitances toward the substrate, while producing low-value surface resistances and obviating the critical aspects of the process steps for fabricating capacitive elements with which conventional methods are beset.

In embodiments of the present invention, a lower plate for a capacitive element is formed that is integrated in a semiconductor substrate from a metallization layer as employed for multi-level interconnection purposes, and forming an upper plate of the capacitive element from a sacrificial conductive layer.

Based on this principle, an embodiment of the invention is a method to fabricate the high-capacitance capacitive elements integrated in a semiconductor substrate by forming a dielectric layer over the semiconductor layer, depositing a metallization layer onto the dielectric layer, and then defining lower plates of the capacitive elements, as well as interconnection pads, by conforming said metallization layer. Next, an intermediate dielectric layer is formed onto the lower plates and interconnection pads, over the entire exposed surface of the semiconductor. Then a sacrificial conductive layer is deposited onto the intermediate dielectric layer, and upper plates of the capacitive elements are defined by conforming the sacrificial conductive layer.

The features and advantages of a method according to the invention can be more clearly understood by reading the following description of an embodiment thereof, given by way of example and not of limitation with reference to the accompanying drawings.

DETAILED DESCRIPTION

Figure 1:
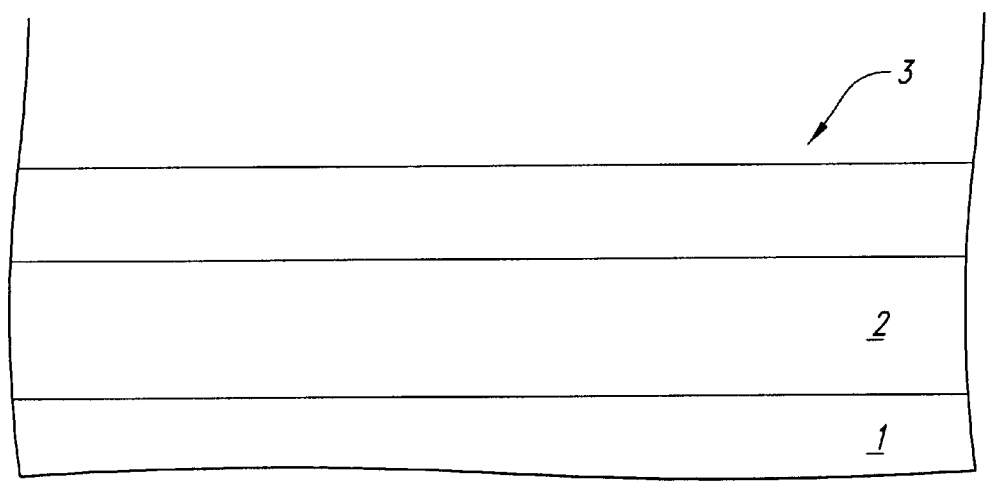
FIGS. 1–8 are vertical cross-section views showing a semiconductor substrate portion in different process steps for forming a capacitive element, according to an embodiment of the invention.
Figure 2:
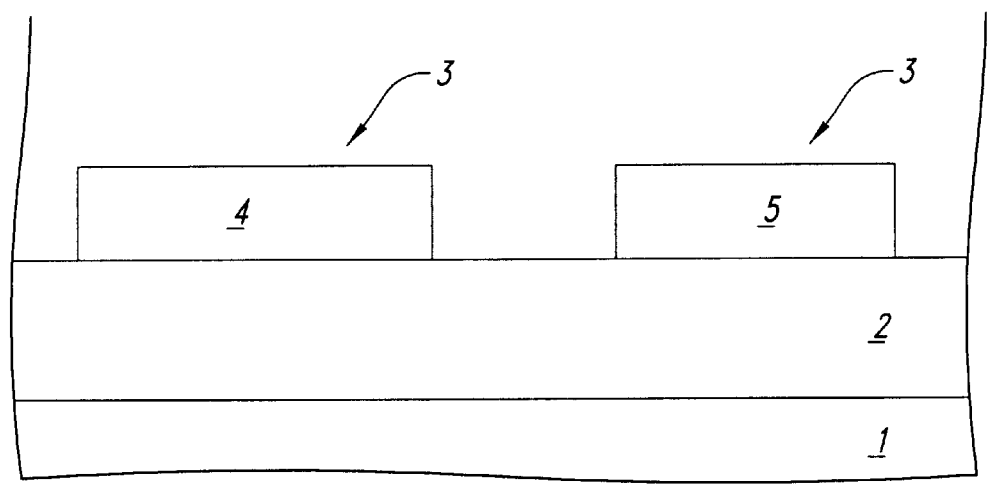

Referring to the drawing views, a method of fabricating high-capacitance capacitive elements C on a semiconductor substrate 1 will now be described. The process steps and the structures described hereinafter are not exhaustive of a process flow for fabricating integrated circuits. This embodiment can be practiced along with the integrated circuit fabricating techniques currently employed by the industry, and only such conventional process steps as are necessary to an understanding of the invention will be discussed. Discussion of processes or structures well known to those in the art has been abbreviated or eliminated for brevity.

The cross-sectional drawings which show portions of an integrated circuit through its fabrication process are not drawn to scale but rather scaled to highlight major features of this embodiment of the invention.

Shown in FIG. 1, a dielectric layer 2 is deposited onto a semiconductor substrate 1. The thickness dimension of this dielectric layer 2 is, for example, the sum of the thicknesses of silicon oxide layers which have been grown in the course of the various thermal oxidation processes provided for the fabrication of electronic devices or elementary components, plus those of intermediate dielectrics occurring between successive metallization layers.

Advantageously, the thicker this dielectric layer 2, and therefore the lower its dielectric permittivity, the higher will be the ratio of the capacitance of a capacitive element C fabricated to its parasitic capacitance toward the substrate 1.

A metallization layer 3 is formed on top of this dielectric layer 2. In particular, this metallization layer may belong to an intermediate metallization layer, instead of being the first metallization layer to be formed in the circuit.

The metallization layer 3 is patterned photolithographically to provide, on the surface of the dielectric layer 2, a plurality of metallization flats 4 later to act as the lower plates of the capacitive elements C, and provide a number of interconnection pads 5 for establishing connections to a following metallization layer.

Thus, the metallization layer 3 serves two functions: to provide the lower plate of a capacitor element according to this embodiment of the invention, and provide an interconnection layer between devices or functional blocks formed on the dielectric layer 2.

Figure 3:
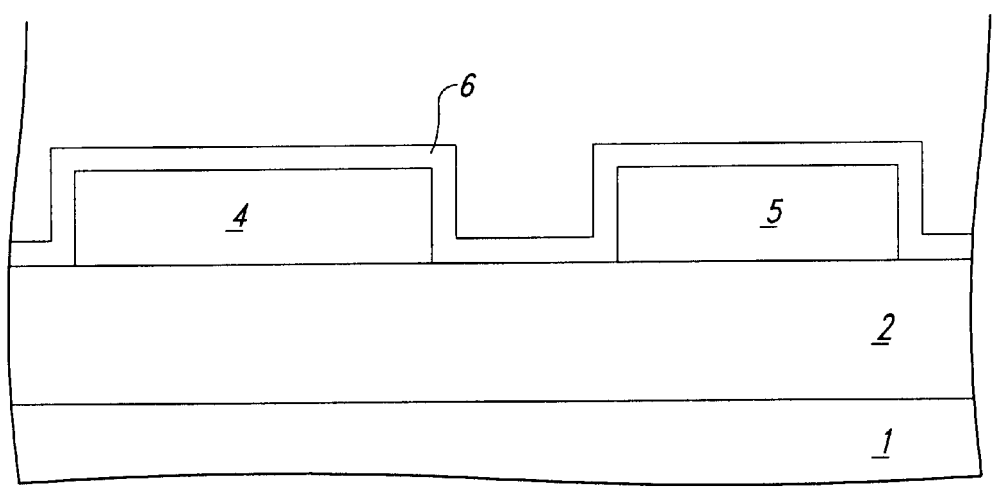

Next, another intermediate dielectric layer 6 is deposited over the metalization flats 4, the interconnection pads 5, and the surface of the dielectric layer 2, as shown in FIG. 3. This layer will provide a dielectric between the plates of the capacitive elements, as discussed below.

In a particular embodiment, the intermediate dielectric layer 6 can be deposited using lower thermic balance processes which are compatible with the presence of metallic layers beneath. This intermediate dielectric layer 6 exhibits good adhesion to metal and high dielectric permittivity, so that it will permit the fabrication of capacitive elements having a high specific capacitance. In addition, the intermediate dielectric layer 6 is made of a material exhibiting high dielectric strength.

The thickness of the intermediate dielectric layer 6 should be adequate to ensure a high specific capacitance, and at the same time be sufficiently strong not to impair its functionality. Advantageously, this intermediate dielectric layer 6 is silicon nitride—deposited by plasma enhanced CVD—because this is extensively used in the fabrication of integrated circuits, and thus economical.

However, the intermediate dielectric layer 6 could be made of such high dielectric permittivity materials as tantalium or titanium oxides, strontium or barium/strontium titanates, to be obtained by either physical or chemical vapor deposition from organometallic precursors.

Figure 4:
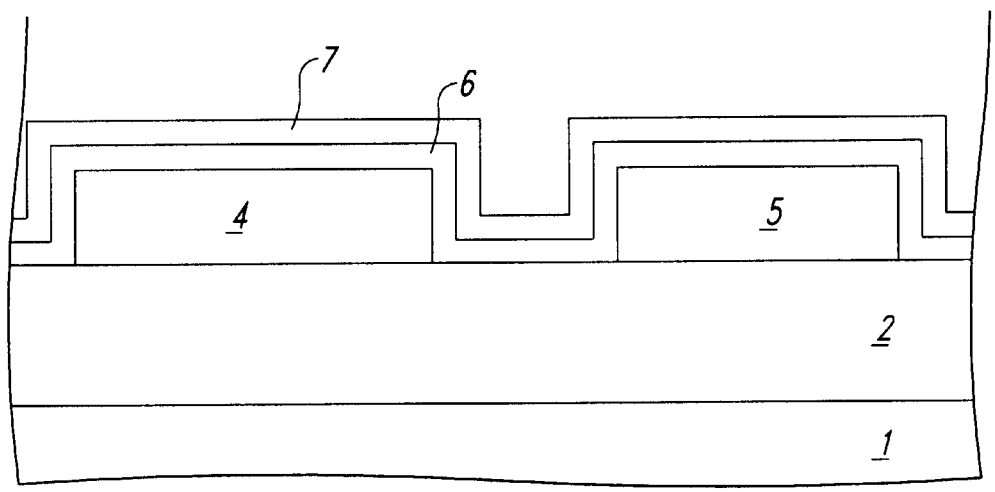

As shown in FIG. 4, a sacrificial metallization layer 7 is deposited onto the intermediate dielectric layer 6 directly afterwards.

Figure 5:
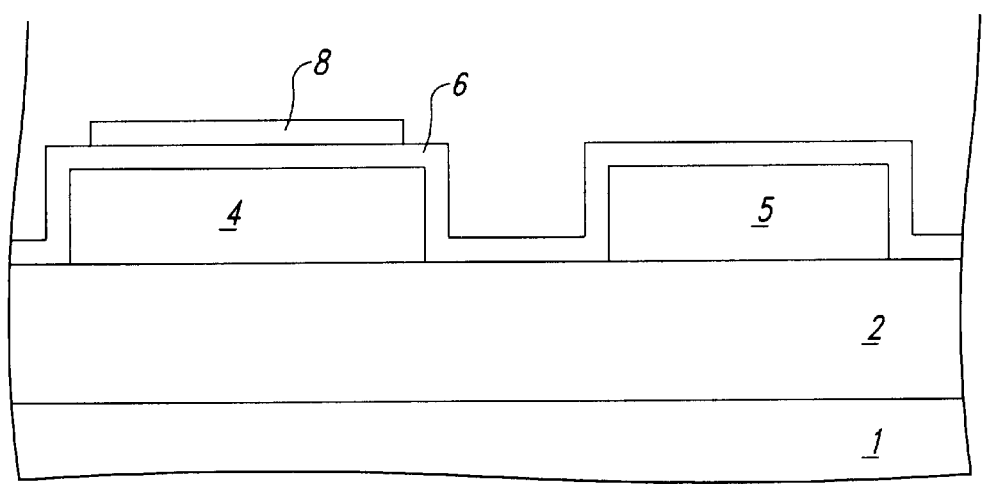

As shown in FIG. 5, the next step is to photolithographically pattern the sacrificial metallization layer 7 to form an upper plate 8 of the capacitive element. This sacrificial metallization layer 7 is used for the upper plates of the capacitive elements, and not for interconnection purposes. Advantageously, the sacrificial metallization layer 7 serves the single function of providing the upper plate 8 for the capacitive element.

No particular requirements apply to the type or the thickness of this metallization layer 7, as do instead to those of the plates formed through an interconnect layer, and the metallization layer 7 can be selected with regard to manufacturing considerations only, such as to minimize the cost of this process step.

This step requires a high selectivity of the etching between the sacrificial metallization layer 7 and the intermediate dielectric layers 6, so that at least a residual layer of intermediate dielectric 6 is left after the metallization layer 7 is etched, to protect the interconnection pad 5 beneath.

Figure 6:
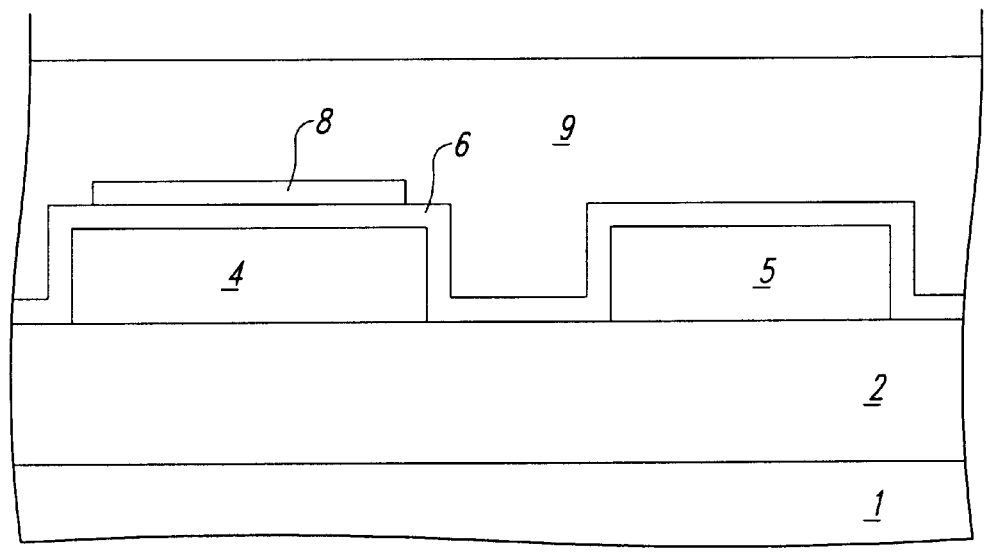
Figure 7:
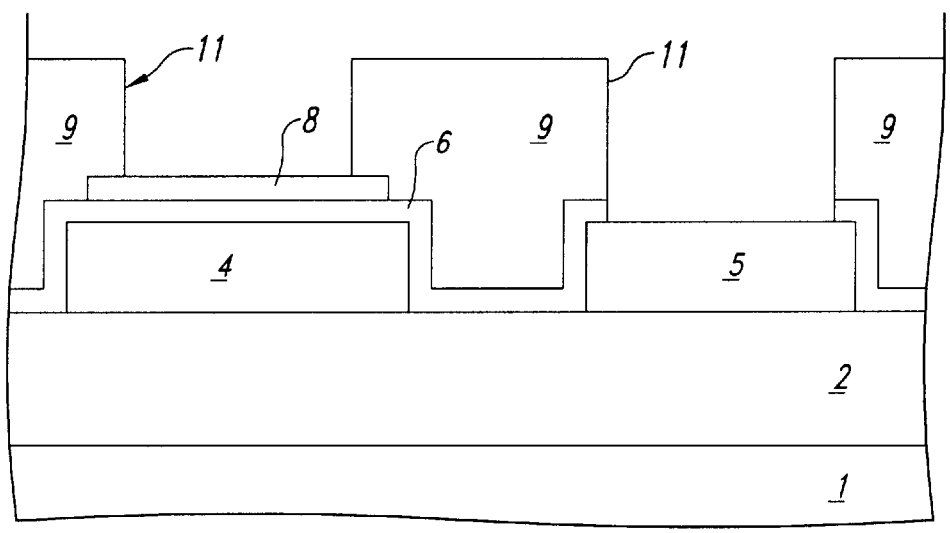

FIG. 6 shows an upper dielectric layer 9 which is deposited over the substrate 1 to ensure isolation of the successive metallization levels. Openings 10 and 11 are formed in this upper dielectric layer 9 at the location of the upper plate 8, and at the interconnection pad 5, respectively, in order to provide an interconnection with the next metallization layer, as shown in FIG. 7.

During the step of forming the opening 11, the portion of the intermediate dielectric layer 6 which extends over the surface of the interconnection pad 5 is removed.

Greater flexibility than conventional is afforded in selecting the upper dielectric layer 9, since it is not necessary for the layer 9 to be selectively etchable relative to the intermediate dielectric layer 6 in making the contact openings 10, 11.

In fact, the capacitive element C will have been defined, and the intermediate dielectric layer 6 protected, by the overlying sacrificial metallization layer 7. During that step, it is important that selectivity relative to the underlying metal surfaces, namely the sacrificial metallization layer 7 and the metallization layer 3, is ensured.

Figure 8:
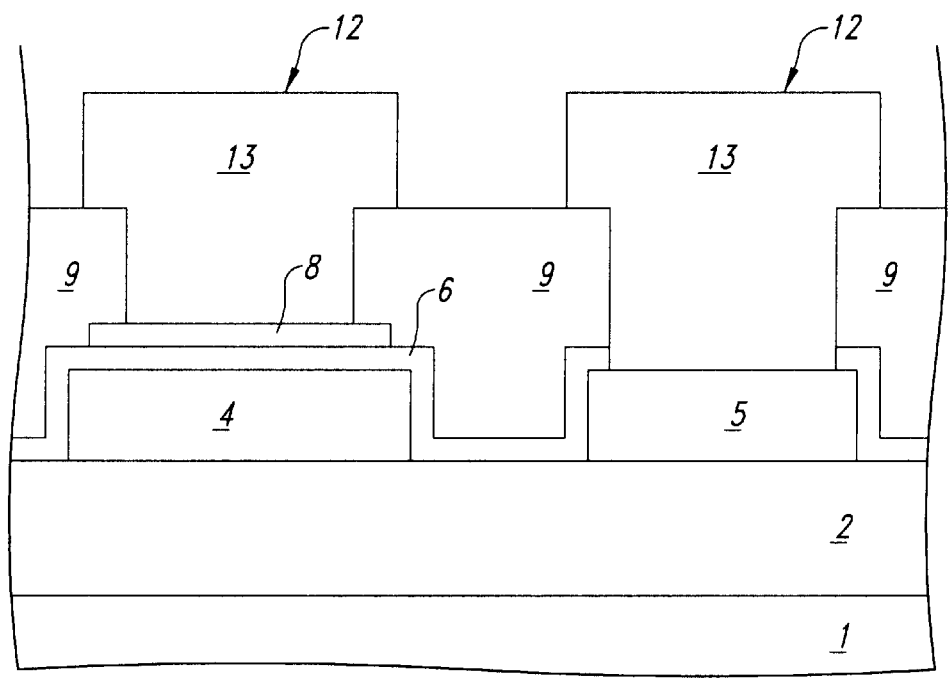

The fabrication of the capacitive element is completed with the deposition, and subsequent photolithographic patterning, of a following metallization level 12 (FIG. 8) to provide contact regions 13 at the upper plates 8 and the interconnection pads 5, respectively.

In summary, the method of this embodiment of the invention allows capacitive elements C to be produced by less critical process steps than in the prior art. By forming the upper plates 8 of the capacitive element C from a sacrificial metallization layer 7, the specially critical process step of selectively removing superposed dielectric layers, which impaired the operability of the ultimate capacitive element in the prior art, is avoided.

What is claimed is:

1. A method for fabricating high-capacitance capacitive elements integrated in a semiconductor substrate comprising:

forming a dielectric layer over said semiconductor substrate;

depositing a first metallization layer onto said dielectric layer;

patterning and etching said first metallization layer into lower plates of said capacitive elements and into interconnection pads;

forming an intermediate dielectric layer on said lower plates and said interconnection pads, and over the entire exposed surface of said semiconductor substrate;

depositing a sacrificial conductive layer onto said intermediate dielectric layer; and defining upper plates of said capacitive elements out of said sacrificial conductive layer.

2. The method of fabricating capacitive elements according to claim 1, further comprising:

forming over the entire semiconductor substrate, an upper dielectric layer;

forming openings in said upper dielectric layer extending to said upper plates; and forming openings in said upper dielectric layer extending to said interconnection pads.

3. The method of fabricating capacitive elements according to claim 1, further comprising forming from a single second metallization layer, contact regions at said upper plates and said interconnection pads.

4. A method for fabricating a plurality of capacitors integrated in a semiconductor substrate, the method comprising:

depositing a first dielectric layer on the semiconductor substrate;

depositing a first metal layer onto the first dielectric layer;

forming portions of the first metal layer into a plurality of lower plates for the respective plurality of capacitors;

forming other portions of the first metal layer into a plurality of interconnection pads;

depositing an intermediate dielectric layer on the plurality of lower plates, the semiconductor substrate, and the plurality of interconnection pads;

depositing a second metal layer over the intermediate dielectric layer; and forming a portion of the second metal layer into a plurality of upper plates for the respective plurality of capacitors.

5. The method of claim 4, further comprising:

depositing an upper dielectric layer over the second metal layer;

forming first openings in the upper dielectric layer extending to the plurality of upper plates;

forming second openings in the upper dielectric layer extending to the plurality of interconnection pads;

depositing a third metal layer over the upper dielectric layer;

forming first contact regions through the first openings; and forming second contact regions through the second openings.

6. The method of claim 5, wherein depositing an upper dielectric layer over the second metal layer comprises depositing an upper dielectric layer that is etchably selective to the first metal layer and the second metal layer.

7. The method of claim 4, wherein depositing an intermediate dielectric layer comprises a lower thermic balance process.

8. The method of claim 4, wherein depositing an intermediate dielectric layer comprises depositing silicon nitride by plasma enhanced chemical vapor deposition.

9. A capacitor integrated in a semiconductor substrate, formed by the steps of:

forming a first dielectric layer over the semiconductor substrate;

forming a first metal layer onto the first dielectric layer;

forming a portion of the first metal layer into a lower plate for the capacitor;

forming another portion of the first metal layer into an interconnection pad;

depositing an intermediate dielectric layer on the lower plate, the semiconductor substrate, and the interconnection pad;

depositing a second metal layer over the intermediate dielectric layer; and forming a portion of the second metal layer into an upper plate for the capacitor.

10. The capacitor of claim 9 further formed by the steps of:

depositing an upper dielectric layer over the second metal layer;

forming a first opening in the upper dielectric layer extending to the upper plate; and forming a second opening in the upper dielectric layer extending to the interconnection pad.

11. The capacitor of claim 10 further formed by the steps of:

depositing a third metal layer over the upper dielectric layer;

forming a first contact region through the first opening; and forming a second contact region through the second opening.

12. The capacitor of claim 9, wherein the intermediate dielectric layer comprises silicon nitride deposited by a lower thermic balance process.

13. The capacitor of claim 10, wherein the upper dielectric layer is etchably selective to the first metal layer and the second metal layer.

* * * * *

UNITED STATES PATENT AND TRADEMARK OFFICE
CERTIFICATE OF CORRECTION

PATENT NO. : 6,420,238 B1
DATED : July 16, 2002
INVENTOR(S) : Sebastiano Ravesi et al.

It is certified that error appears in the above-identified patent and that said Letters Patent is hereby corrected as shown below:

<u>Title page,</u>
Item [30], Foreign Application Priority number should read as -- MI98A002788 --.

Signed and Sealed this

Thirty-first Day of December, 2002

JAMES E. ROGAN
*Director of the United States Patent and Trademark Office*